US006674304B1

(12) United States Patent
Matthews

(10) Patent No.: US 6,674,304 B1
(45) Date of Patent: Jan. 6, 2004

(54) OUTPUT BUFFER CIRCUIT AND METHOD OF OPERATION

(75) Inventor: Lloyd P. Matthews, Buda, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/258,378

(22) Filed: Feb. 26, 1999

(51) Int. Cl.$^7$ .................. H03K 19/0175; H03K 3/00; H03K 17/16

(52) U.S. Cl. .................. 326/80; 326/80; 326/81; 326/83; 326/63; 326/68; 327/112; 327/384; 327/387

(58) Field of Search .................. 326/68, 63, 80, 326/81, 82, 83, 30, 113; 327/112, 384, 387, 388, 382, 403, 404

(56) References Cited

U.S. PATENT DOCUMENTS

| 4,782,250 A | 11/1988 | Adams et al. ............... 307/473 |
| 4,963,766 A | 10/1990 | Lundberg .................... 307/451 |
| 5,124,585 A | 6/1992 | Kim et al. ................... 307/482 |
| 5,144,165 A | 9/1992 | Dhong et al. ................. 307/451 |
| 5,151,619 A | 9/1992 | Austin et al. ................ 307/473 |
| 5,160,855 A | 11/1992 | Dobberpuhl ................. 307/270 |
| 5,191,244 A | 3/1993 | Runaldue et al. ........... 307/475 |
| 5,223,751 A | 6/1993 | Simmons et al. ........... 307/475 |
| 5,243,236 A | 9/1993 | McDaniel .................... 307/443 |
| 5,266,849 A | 11/1993 | Kitahara et al. ............. 307/475 |
| 5,276,364 A | 1/1994 | Wellheuser ................. 307/475 |
| 5,300,835 A | 4/1994 | Assar et al. ................. 307/475 |
| 5,467,455 A | 11/1995 | Gay et al. ................... 395/281 |
| 5,497,106 A | 3/1996 | Raatz et al. ................. 326/30 |
| 5,606,275 A | 2/1997 | Farhang et al. ............. 327/108 |
| 5,635,861 A * | 6/1997 | Chan et al. ................... 326/81 |
| 5,684,415 A * | 11/1997 | McManus .................... 326/81 |
| 5,896,045 A * | 4/1999 | Siegel et al. ................. 326/81 |
| 5,910,734 A * | 6/1999 | Manning ..................... 326/81 |
| 5,973,511 A * | 10/1999 | Hsia et al. .................... 326/81 |
| 5,990,706 A * | 11/1999 | Matsumoto et al. .......... 326/98 |
| 6,020,762 A * | 2/2000 | Wilford ....................... 326/81 |
| 6,040,711 A * | 3/2000 | Airaksinen et al. .......... 326/81 |

OTHER PUBLICATIONS

Dobberpuhl et al., "A 200–MHz 64–b Dual–Issue CMOS Microprocessor," IEEE, pp. 1555–1567 (1992).

* cited by examiner

Primary Examiner—Michael Tokar
Assistant Examiner—Vibol Tan
(74) Attorney, Agent, or Firm—Daniel D. Hill

(57) ABSTRACT

An output buffer (100) contains a low voltage driver (110), a medium voltage driver (108), and a high voltage driver (106). When an output pad (112) is configured to operate between ground and the medium voltage, the low voltage driver (110) is first used during low-to-high transitions to drive the output pad (112) from ground to an intermediate voltage in a fast manner. After the intermediate voltage is obtained on the output pad (112), a detection circuit (111) will switch output pad control from the low voltage driver (110) to the medium voltage driver (108). The medium voltage driver (108) will drive the output pad (112) from the intermediate voltage to the final logic one output voltage. This two-stage low-to-high driving methodology ensures that there will be less delay time from input (DO) to the output pad (112). In addition, the drivers (108) and (110) contain protection transistors (228), (231), and (266) that allow programming on reset to be accomplished in an error free manner through use of the output pad (112) as an input during reset operations.

20 Claims, 3 Drawing Sheets

US 6,674,304 B1

OUTPUT BUFFER CIRCUIT AND METHOD OF OPERATION

FIELD OF THE INVENTION

The present invention relates generally to electrical circuits, and more particularly to, an output buffer circuit for use in integrated circuits (ICs) that is compatible with many different supply voltages.

BACKGROUND OF THE INVENTION

Current integrated circuits (ICs) that are used in modern electrical systems must be designed to effectively and efficiently communicate between many different types of devices that are powered by many different voltage supplies. For example, it is not unusual for a high voltage sensor or motor operating at tens or hundreds of volts to be wired for communication to a five volt line driver, a 3.3 volt microcontroller unit (MCU), a 2.5 volt timer peripheral, and/or a 1.8 volt memory device. In order for these devices to effectively communicate with each other in an electrical design, the input and output buffers of the various integrated circuits in the design must be able to accommodate many different voltages at any time and under any operating conditions. The need for voltage compatibility between many different power supply voltages used on many different ICs has significantly complicated the design of IC output buffers over recent years.

Due to the complexity required for wide-ranging voltage compatibility, output buffers are now consuming more IC substrate surface area, operating at relatively slower speeds due to added circuit overhead, and experiencing glitches or errors in operation that have rendered some output buffers less flexible or nonfunctional in some applications or uses.

The above issues can be illustrated with respect to FIG. 1. FIG. 1 illustrates a conventional output buffer circuit 10 that is currently used in the IC industry. The circuit 10 is provided with a data output (DO) signal 13 and an output enable (OE) 15 as shown in FIG. 1. A driver control circuit 11 is used to adjust voltages up or down to more compatible voltages for circuit 10, and is used to convert the DO and OE signals to control signals that can be used by a P channel pull-up portion of the circuit 10. An N channel pre-driver 14 performs similar functions for N channel devices and various pull-down circuitry illustrated in circuit 10.

For the P channel pull-up circuitry of FIG. 1, the driver control circuit 11 will provide a control signal, responsive to the OE and DO signals, to one or more inverters 12. The inverter 12 will provide, via interconnection 17, a drive high signal to a switch 16. When the signal 17 is a logic zero, the circuit 10 is to drive an output pad 28 to a logic one, when the signal 17 is logic one, the P channel pull-up circuitry is disabled, whereby the circuit 10 is either in a tri-state mode or a pull-down mode. The switch 16 contains an N channel transistor that has a gate electrode connected to the power supply voltage (VDD). The switch 16 also contains a P channel pass transistor that is gated by a voltage resident on the output pad 28.

The switch 16 will pass the voltage resident on node 17 to the node 19. The node 19 provides this signal to a pull-up P channel transistor 18. The pull-up transistor 18 is coupled to VDD and is selectively enabled by the node 19 to pull the output pad 28 to a high voltage when the output pad 28 is to be driven to a logic one. The N channel pull-down transistor 20 illustrated in FIG. 1 is selectively enabled, mutually exclusive of the transistor 18, to selectively pull the output pad 28 to a low voltage to output a logic zero value. A P channel transistor 22 is used to render the output buffer of FIG. 1 compatible with other voltages that may be provided from time to time on output pad 28 by other circuitry. For example, voltages higher than VDD may be applied to the pad 28, whereby the transistor 22 ensures that the voltage at the node 19 follows the voltage at the output pad 28. Such voltage following in pad overvoltage cases is desired so that the transistor 18 does not erroneously turn on during overvoltage events whereby IC power is wasted.

A switch 24 in FIG. 1 is also used to provide some voltage compatibility to the circuit 10 of FIG. 1. Switch 24 selectively biases the bulk connections of transistors 18 and 22 and a bulk connection of the P channel transistor of switch 16 to avoid adverse consequences of voltage mismatches between VDD and the pad voltage on pad 28. Generally, the switch 24 provides a greater of either VDD or a voltage on the output pad 28 to the bulks of the various bulk-interconnected P channel transistors in FIG. 1 to ensure that high voltages provided on the pad 28 do not adversely affect the lower voltage output buffer circuit 10. Therefore, several devices or protection mechanisms in FIG. 1 have already been added to the surface area of the output buffer circuit to ensure that the output pad 28 is somewhat compatible with other supply voltages.

However, it has been found that erroneous operation can result using the circuit of FIG. 1, even though precautions have been taken to add circuitry to ensure that circuit 10 of FIG. 1 is compatible with other power supply voltage levels. In common integrated circuit designs, some output pads 28 may be used as an input mechanism during reset operations. In other words, during reset, the output pins 28 provide binary values into the packaged IC in order to allow a microprocessor, microcontroller, DSP, or like device within the IC to be configured dynamically upon reset. For example, the pad 28 of FIG. 1 is illustrated as being connected to a pull-down resistor 26. Upon reset, the resistor 26 is designed to pull the pad 28 to a ground potential while the transistors 18 and 20 are shut off in reset to tri-state the circuit 10 from the pad 28. The IC that includes the circuit 10 can then read the voltage value on the pad 28 and configure itself accordingly. When a pull-down resistor 26 is used, the device is to configure itself into a first mode of operation in response to the logic zero on the pad 28. Had the pad 28 been connected to a pull up resistor which drove the pad 28 to a logic one, the IC would have programmed itself into a different mode of operation.

In FIG. 1, experiments have shown that the pad 28 has in some cases been driven by the circuit 10 to a logic one value or 3.3 volts followed by a reset event. At that point, with the pad at 3.3 volts, OE 15 will turn off the transistors 18 and 20 and cause circuit 10 to enter a tri-state mode. In this tri-state mode, the node 19 is driven to a logic one in order to shut the transistor 18 off. However, the 3.3 volts provided at node 17 will experience an N channel threshold voltage drop (Vtn) through the switch 16 whereby the voltage at node 19 will be VDD minus one Vtn. If Vtn is greater than the threshold voltage of the transistor 18 (Vtp), then the transistor 18 may be operating at an on-state or a partially on-state. When on or partially on, the transistor 18 is supplying some leakage current to the pad 28 whereby the path from VDD through the transistor 18 and resistor 26 to ground begins to function as a voltage divider. Depending upon the strengths of the devices 18 and 26, it has been found that the resister 26 is not always strong enough to pull the pad 28 to ground as was intended during reset. Due to this inability of the resistor 26 to pull the pad 28 to ground, the IC which uses the circuit of FIG. 10 to configure itself on reset will be configured into a wrong operational state (i.e., it will sense a logic one on the pad 28 when a logic zero was intended).

In addition to the above problem of erroneous configuration operations, the DO and OE signals are generally provided from a central processing unit (CPU) core or microcontroller that is operating in low voltage modes in the vicinity of 1.8 volts to 2.5 volts. In the case where the VDD of FIG. 1 is higher than that voltage provided on CPU signals (i.e., the circuit 10 may be using VDD values of 3.3 volts or 5 volts), the driver control circuitry 11 must level shift the DO and/or OE voltages from the lower voltage to a higher voltage that is more compatible with the higher voltage VDD. Such level shifting operations have been shown to take several nanoseconds of time in some designs. This level shifting delay of several nanoseconds impacts the ability of a driver to provide output data in a timely manner. Therefore, in addition to the need to correct the operational errors experienced by existing output buffers, a need exists in the industry to improve the performance and response time of output buffers while simultaneously ensuring that voltage compatibility is still adequate.

Therefore, a need exists in the industry for an output buffer that provides error free operation over wide voltage ranges while improving the DO-to-pad propagation delay of the output buffer and/or reducing a surface area consumed by the output buffer circuitry.

DETAILED DESCRIPTION OF A PREFERRED EMBODIMENT

Generally, the present invention provides an output buffer circuit having a low voltage driver circuit that operates at a first power supply voltage, a medium voltage driver circuit that operates at a second power supply voltage, and a high voltage driver circuit that operates at a third power supply voltage. When the high voltage driver is used, the medium and low voltage drivers are disabled. When the low and medium voltage drivers are used, the high voltage driver is disabled. When the low and medium voltage drivers are enabled, and a logic low to logic high transition occurs, the low voltage driver provides most of the initial drive of the output pad voltage. A pad voltage detection circuit and switch is used to sense the pad voltage, and at a predetermined voltage, cause the low voltage driver circuit to be disabled. The medium voltage driver continues to drive the output pad to the second power supply voltage.

This output buffer circuit allows an integrated circuit to communicate with external circuits that operate at different power supply voltages. The low voltage driver uses a low voltage transistor for the output pad driver that is both stronger and requires less surface area than a comparable high voltage transistor. The medium voltage driver uses a high voltage transistor as the output pad driver, and requires a level translation circuit which causes additional delay in the low to high transition of the output pad voltage. Therefore, the stronger low voltage driver is used to very quickly drive the output pad voltage to the lower power supply voltage level, while the data propagates through the level translation to the medium voltage driver, which more slowly drives the pad to the final voltage.

Figure 1:
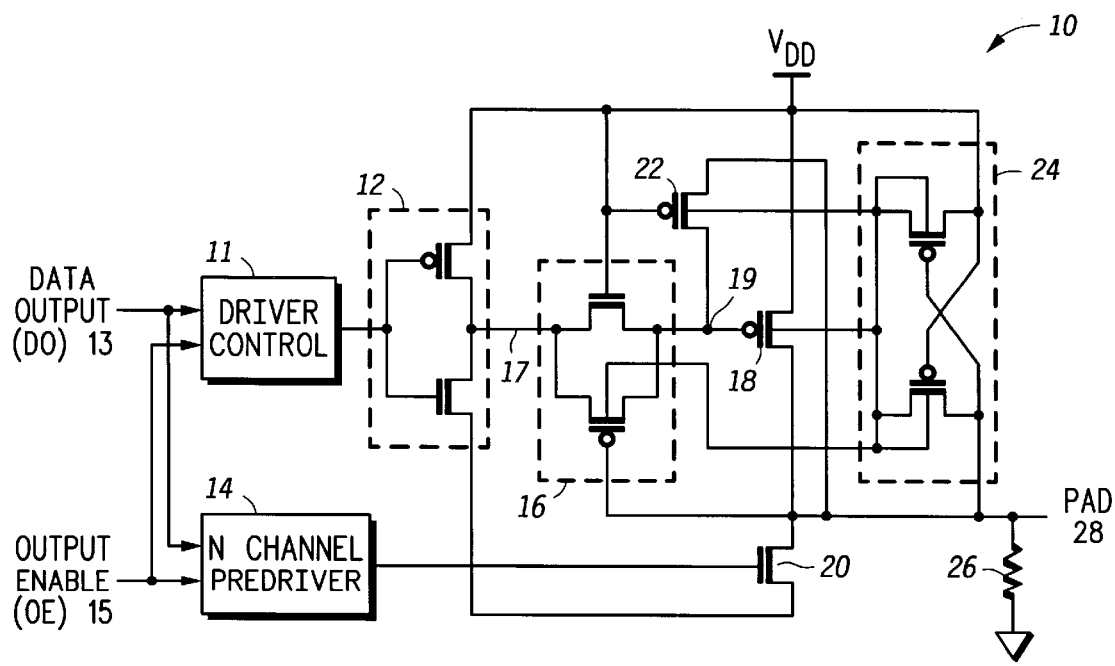
FIG. 1 illustrates, in circuit schematic diagram form, an output buffer that is currently used in the integrated circuit (IC) industry.
Figure 2:
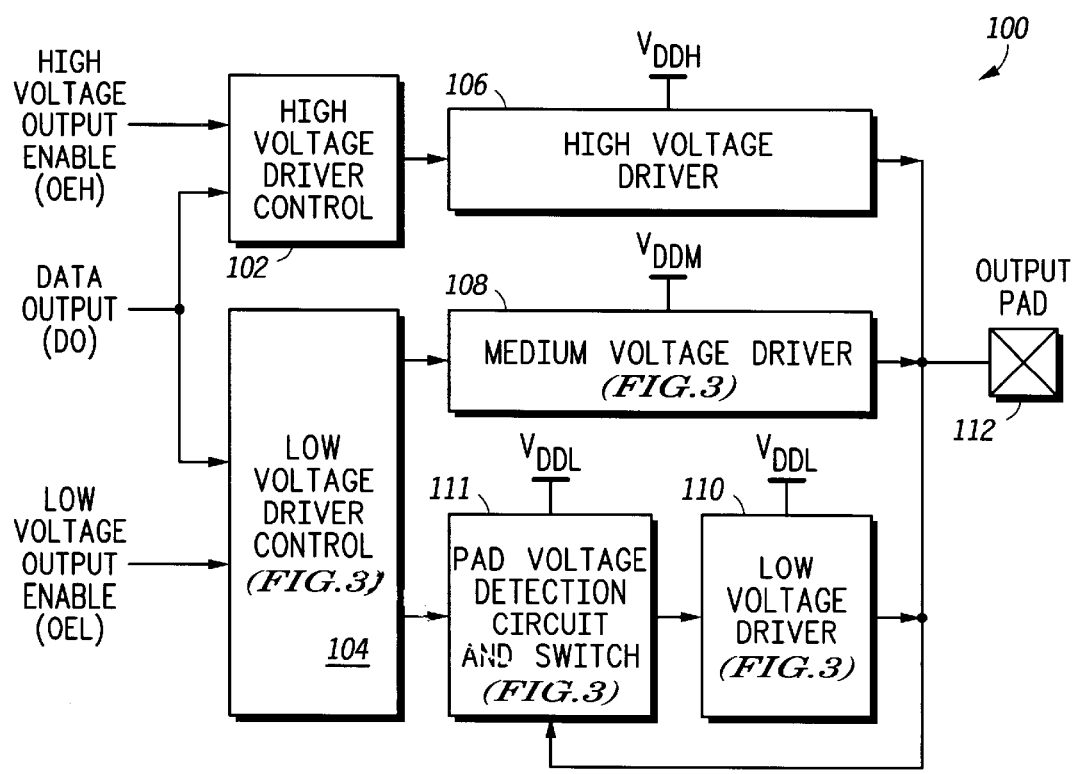
FIG. 2 illustrates, in block diagram form, an output buffer that is improved over the prior art.

FIG. 2 illustrates, in block diagram form, output buffer circuit 100 an output buffer that is improved over the prior art. Output buffer circuit 100 includes high voltage driver control 102, low voltage driver control 104, high voltage driver 106, medium voltage driver 108, pad voltage detection circuit and switch 111, low voltage driver 110, and output pad 112. High voltage drive control 102 has a first input terminal for receiving a high voltage output enable signal (OEH), a second input terminal for receiving output data (DO), and an output terminal. Low voltage driver control 104 has a first input terminal for receiving output data DO, a second input terminal for receiving a low voltage output enable (OEL), a first output terminal, and a second output terminal. High voltage driver 106 has an input terminal coupled to the output terminal of high voltage driver control 102, and an output terminal coupled to output pad 112. Medium voltage driver 108 has an input terminal coupled to the first output terminal of low voltage driver control 104 and an output terminal coupled to output pad 112. Pad voltage detection circuit and switch 111 has an input terminal coupled to the second output terminal of low voltage driver control 104, a second input terminal coupled to output pad 112 and an output terminal. Low voltage driver 110 has an input terminal coupled to the output terminal of pad voltage detection circuit and switch 111, and an output terminal coupled to output pad 112. Note that in FIG. 2 only one line is shown coupling circuit blocks together for the purpose of simplicity and clarity. However, in the illustrated embodiment there may be more than one line providing electrical coupling between the circuit blocks.

High voltage driver 106 receives a power supply voltage labeled VDDH. Medium voltage driver 108 receives a power supply voltage labeled VDDM. Pad voltage detection circuit and switch 111 and low voltage driver 110 receive a power supply voltage labeled VDDL. In the illustrated embodiment, VDDH is about 5 volts, VDDM is about 3.3 volts, and VDDL is about 2.5 volts. In other embodiments, these power supply voltages may be different.

In operation, output buffer 100 is used to provide an output signal from one integrated circuit that operates at one power supply voltage to another integrated circuit that may operate at another power supply voltage. For example, in the illustrated embodiment, internal circuits (not shown) that provide output data DO to output buffer 100 operate at 2.5 volts. Output pad 112 may be coupled to another integrated circuit for providing an external signal at either 5 volts or 3.3 volts. For output buffer 100 to drive output pad 112 to 5 volts, the high voltage output enable signal OEH would be asserted as a logic high and the low voltage output enable signal OEL would be asserted as a logic low. This enables high voltage driver control 102 and high voltage driver 106 to convert the 2.5 volt data output signal DO to an output signal having a rail-to-rail voltage of from about 0 volts to 5 volts at a sufficient drive strength to be used by the external circuit.

During 5 volt output operation, low voltage driver control 104 and pad voltage detection circuit and switch 111 cause the medium voltage driver 108 and the low voltage driver 110 to be tristated. Likewise, when an output signal is desired to be outputted at 3.3 volts or lower, low voltage output enable signal OEL is asserted as a logic high, and high voltage enable signal OEH is asserted as a logic low. High voltage driver control 102 causes the high voltage driver 106 to be tristated while low voltage driver control 104 and pad voltage detection circuit and switch 111 control the operation of drivers 108 and 110.

When OEL is a logic high and OEH is a logic low, low voltage driver 110 and medium voltage driver 108 are enabled to drive output pad 112. During a logic low to a logic high transition of the data output signal DO, low voltage driver control 104 causes low voltage driver 110 to initially drive output pad 112. When the rising output voltage reaches a predetermined voltage, pad voltage detection circuit and switch 111 senses the predetermined pad voltage and causes low voltage driver 110 to be disabled. Medium voltage driver 108 continues to pull the output pad to 3.3 volts.

Note that in the illustrated embodiment, output buffer 100 is used to drive output pad 112 to 3.3 volts or to 5 volts. In other embodiments, output buffer 100 may also be used to supply a 2.5 volt output signal by making medium voltage driver 108 separately selectable from low voltage driver 110. Also, in other embodiments, the number of output voltages provided by output buffer 100 may be increased by adding additional driver circuits and a pad voltage detection circuit and switch (similar to pad voltage detection circuit and switch 111) to the lower voltage drivers.

Figure 3:
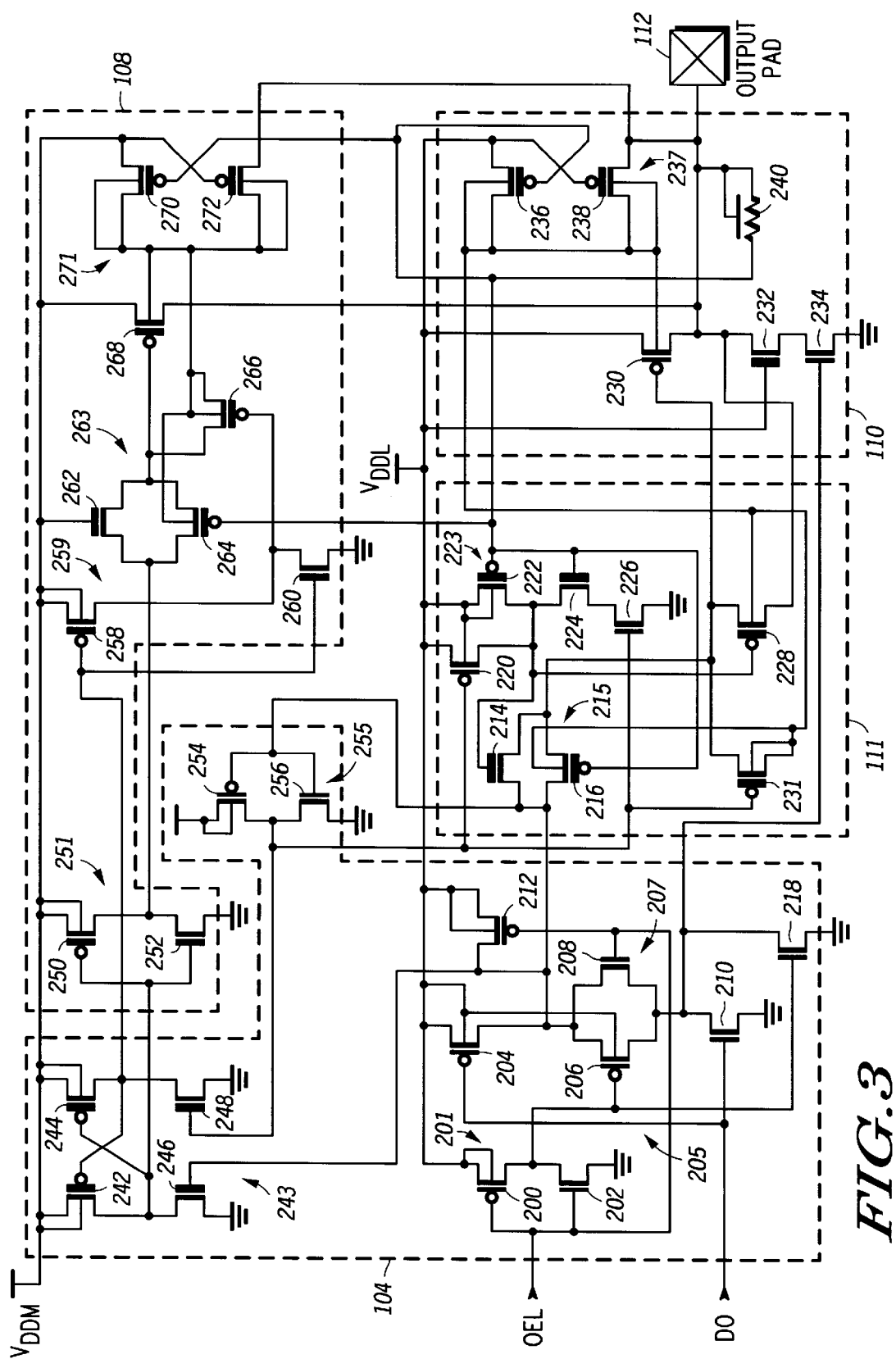
FIG. 3 illustrates, in circuit schematic diagram form, portions of the output buffer of FIG. 2 in more detail.

FIG. 3 illustrates, in schematic diagram form, low voltage driver control 104, medium voltage driver 108, low voltage driver 110, and pad voltage detection circuit and switch 111 in more detail. Note that high voltage driver 106 and high voltage driver control 102 (FIG. 2) can be any type of driver circuit that can receive a 2.5 volt signal and drive an output terminal, or pad, at 5 volts, and will not be shown or discussed in detail. In FIG. 3, low voltage driver control 104 includes P channel transistors 200, 204, 206, 212, 242, 244, and 254, and N channel transistors 202, 208, 210, 218, 246, 248, and 256. Pad voltage detection circuit and switch 111 includes P channel transistors 216, 220, 222, 228, and 231, and N channel transistors 214, 224, and 226. Medium voltage driver 108 includes P channel transistors 250, 258, 264, 266, 268, 270 and 272, and N channel transistors 252, 260, and 262. Low voltage driver 110 includes P channel transistors 230, 236, and 238 and N channel transistors 232, 234, and resistor 240.

P channel transistor 200 and N channel transistor 202 are coupled to form an inverter 201. Inverter 201 has an input terminal for receiving low voltage output enable signal OEL, and an output terminal. P channel transistor 204 and N channel transistor 210 are coupled to form an inverter 205. A transmission gate 207, which is formed by P channel transistor 206 and N channel transistor 208, is coupled between the source and drain terminals of transistors 204 and 210. Transistors 242, 244, 246, and 248 are coupled to form a level shifter 243. Level shifter 243 is used to level shift, or convert, the low voltage signal from the circuits supplied by VDDL to a higher voltage signal for use by the circuits supplied by VDDM. An input terminal of inverter 205 receives data output signal DO and has a first output terminal coupled to a first input terminal of level shifter 243. A transmission gate, or switch, 215, formed by transistors 214 and 216, has an input terminal coupled to the first output terminal of inverter 205 and an output terminal. P channel pull-up transistor 230 and N channel pull-down transistor 234 are coupled to form the final output driver for output pad 212 of the low voltage driver 110. Note that N channel transistor 234 is also the pull-down output driver transistor for medium voltage driver 108. A channel region of P channel transistor 230 is coupled between output pad 112 and power supply voltage terminal VDDL. A bulk connection of P channel transistor 230 coupled to switch 237. The gate of P channel 230 is coupled to the output terminal of transmission gate 215. P channel transistor 222 and N channel transistor 224 form an inverter 223 having an input terminal coupled to output pad 112 via resistor 240. Note that this is the feedback path shown in FIG. 2 between output pad 112 and pad voltage detection circuit and switch 111. An output terminal of inverter 223 is coupled to N channel transistor 214 of transmission gate 215. Resistor 240 provides input protection for all of the gates coupled to output pad 112. Each of transistors 216, 222, 224, 236, 264, and 270 have their gates coupled to output pad 112 via resistor 240. A second output terminal of inverter 205 is coupled to the gate of N channel transistor 234. Level shifter 243 has a first input terminal coupled to the first output terminal of inverter 205, and a second input terminal coupled to the output terminal of inverter 255. The first output terminal of level shifter 243 is coupled to an input terminal of inverter 251. An output terminal of inverter 251 is coupled to the gate of P channel pull up transistor 268 through transistors 262 and 264. P channel transistor 268 has a channel region coupled between output pad 112 and VDDM. A bulk connection of transistor 268 is coupled to switch 271. Transistors 262 and 264 form a switch 263. The gate of N channel transistor 262 is coupled to VDDM. P channel transistor 264 is connected in parallel with N channel transistor 262. The gate electrode of P channel transistor 264 is coupled to output pad 112 through resistor 240. The second output terminal of level shifter 243 is coupled to the input terminal of inverter 259. An output terminal of inverter 259 is coupled to the gate of P channel transistor 266. P channel transistors 270 and 272 form a switch 271. P channel transistor 272 is gated by the voltage supply at VDDM and has a channel region coupled between output pad 112 and the bulk connection of pull up transistor 268. P channel transistor 270 is gated by the output pad 112 voltage. A channel region of P channel transistor 270 is coupled between the voltage supply and the bulk connection of pull up transistor 268. Switch 271 functions to couple the bulk terminal of P channel transistor 268 to the higher of either VDDM or output pad 112. Likewise, transistors 236 and 238 form switch 237. P channel transistor 238 is gated by the voltage supply at VDDL and has a channel region coupled between output pad 112 and the bulk connection of pull up transistor 230. P channel transistor 236 is gated by the voltage at output pad 112. A channel region of P channel transistor 236 is coupled between the voltage supply and the bulk connection of pull up transistor 230. Switch 237 is used to couple the bulk connection of P channel transistor 230 to the higher of either VDDL or output pad 112. The bulk connection can be to either the substrate or to a well region of the integrated circuit depending on the transistor conductivity type and/or process.

Note that in FIG. 3 each of the transistors having a bold gate terminal are implemented as high voltage metal-oxide semiconductor (MOS) devices that are intended to operate at the lower power supply voltages, i.e., 2.5 volts, yet be tolerant to relatively higher voltages, i.e., 5 volts. These transistors are different than low voltage transistors in several ways, such as for example, relative thickness of the gate oxide, source/drain implants, bulk resistivity, etc. All of the other transistors are considered low voltage MOS transistors.

In operation, when high voltage driver 106 is being enabled to drive output pad 112, output enable signal OEL is provided as a logic low voltage to inverter 201, to P channel transistor 212, and N channel transistor 208. N channel transistor 208 is substantially non-conductive and P channel transistor 212 is conductive. A logic high output from inverter 201 is then provided to N channel transistor 218 causing N channel transistor 218 to be conductive. Transistor 218 causes the gate voltage of N channel transistor 234 to be low, causing transistor 234 to be substantially non-conductive. Transmission gate 207 is substantially non-conductive, isolating P channel 204 from N channel 210. P channel transistor 212 is conductive, causing the gate of N channel transistor 246 of level shifter 243 to be pulled to VDDL causing N channel transistor 246 to be conductive. The input terminal of inverter 251 is then pulled to a logic low voltage through transistor 246. A logic high voltage is provided to the gate of P channel transistor 258 causing P channel transistor 258 to be substantially non-conductive. A logic high voltage is provided at the output of inverter 251 to current electrodes of P channel transistor 264 and N channel transistor 262 in order to make transistor 268 substantially non-conductive.

Assuming output pad 112 is at a logic high voltage when OEL is reduced to a logic low voltage, the gate of P channel transistor 264 is high causing P channel transistor 264 to be substantially nonconductive. Because P channel transistor 264 is substantially nonconductive, there is a threshold voltage drop (VT) across the drain and source terminals of N channel transistor 262 causing the gate voltage of P channel transistor 268 to be substantially a VT below power supply voltage VDDM. P channel transistor 268 is suppose to be substantially nonconductive. However, because of the VT drop across N channel transistor 262, P channel transistor 268 may not always be non-conductive. To solve this problem, P channel transistor 266 functions as a clamping transistor and is used to pull the gate of transistor 268 to the bulk potential, thus insuring that P channel transistor 268 remains off. The logic high voltage at the first output terminal of inverter 205 is provided to the input terminal of inverter 255. Inverter 255 provides a logic low to the gate of N channel transistor 248 of level shifter 243 causing N channel transistor 248 to be substantially nonconductive, thus providing the high voltage to the input terminal of inverter 259. P channel transistor 266 is then made conductive in response to a logic low voltage from inverter 259.

When enable signal OEL is a logic low, medium voltage driver 108 and low voltage driver 110 is tristated, and the gate of P channel transistor 212 is low, causing the input terminal of transmission gate 215 to be high and the input of inverter 255 to be high. The low voltage output of inverter 255 is used to cause N-channel transistor 226 to be substantially non-conductive and P channel transistor 220 to be conductive. This causes inverter 223 to be disabled. P channel transistor 220 causes the gate of N channel transistor 214 to be high. The logic high at the first output terminal of inverter 205 passes through N channel transistor 214 to the gate of P channel transistor 230 causing P channel transistor 230 to be substantially non-conductive. Also, the logic high from inverter 201 causes N channel transistor 218 to be conductive, thus pulling the gate of N channel transistor 234 low insuring that N channel pull down transistor 234 will not be conductive.

When low voltage driver 110 and medium voltage driver 108 are used to drive output pad 112, output enable signal OEL is provided as a logic high. High voltage driver 106 is disabled with a logic low enable signal OEH. When output data signal DO is provided as a logic low, inverter 205 provides a logic high voltage causing N channel transistor 234 to be conductive, thus pulling output pad 112 to a logic low voltage. The logic high from inverter 205 is provided to the gate of P channel transistor 230 through transmission gate 215 causing P channel transistor 230 to be substantially non-conductive. N channel transistor 232 is used to isolate low voltage N channel transistor 234 from a potentially damaging high voltage at output pad 112. Note that N channel transistor 232 is a high voltage tolerant transistor.

When output signal DO transitions from a logic low to a logic high signal and OEL is a logic high, transmission gate 207 is conductive and the output of inverter 205 becomes a logic low. The input of inverter 255 is low and the output of inverter 255 is high, causing N channel transistor 226 to be conductive and P channel transistor 220 to be substantially non-conductive, thus enabling inverter 223. The logic low output data signal from the output terminal of inverter 205 is provided to the gate of P channel transistor 230 through transmission gate 215. P channel transistor 230 then begins to pull up the voltage at output pad 112 to VDDL. When the output pad voltage reaches VDDL, the output voltage is sensed by pad voltage detection circuit and switch 111. P channel transistor 216 is non-conductive because its gate is coupled to pad 112 through resistor 240. Inverter 223 will receive the high voltage from pad 112 and provide a low voltage to the gate of N channel transistor 214 causing N channel transistor 214 to be non-conductive and causing P channel transistor 228 to be conductive. The gate of P channel transistor 230 is pulled to the pad voltage and is substantially non-conductive.

At this point, the pad voltage is at VDDL and low voltage driver 110 is no longer providing drive strength to output pad 112. Low voltage driver 110 is disabled, and medium voltage driver 108 continues to drive output pad 112 to VDDM. The logic high voltage from output pad 112 causes transmission gate 215 to be non-conductive and thus isolate the data signal from low voltage driver 110. The logic low from the output terminal of inverter 205 is provided to N channel transistor 246 of level shifter 243 causing N channel transistor 246 to be substantially non-conductive. And because the output of inverter 255 is a logic high, N channel transistor 248 is conductive. Inverter 251 receives a logic high voltage and provides a logic low to transistors 262 and 264. Both the transistors 262 and 264 are conductive causing a logic low voltage to be provided to P channel transistor 268. P channel transistor 268 is conductive causing the voltage output pad 112 to be pulled up to the voltage of VDDM. Also, P channel transistor 258 will be conductive and N channel transistor 260 will be non-conductive causing P channel transistor 266 to be non-conductive preventing P channel transistor 266 from clamping the gate of 268 to the bulk.

Because the low voltage driver uses a low voltage transistor for P channel transistor 230, which is both stronger and requires less surface area than a comparable high voltage transistor, the initial pull-up of output pad 112 can be accomplished relatively quickly. When the initial pull-up is complete, the low voltage driver can be disabled, allowing the medium voltage driver to complete the pull-up to VDDM. This allows the output pad to be pull-up quickly without the gate delays necessary for level shifting the data signal for use by medium voltage driver.

When output signal DO transitions from a logic high to a logic low, inverter 205 provides a logic high. Inverter 255 provides a logic low voltage to cause N channel transistor 226 to be substantially non-conductive and P channel transistor 220 to be conductive. Therefore, N channel transistor 214 is conductive and P channel transistor 228 is nonconductive which isolates the gate of P channel transistor 230 from output pad 112. Because transmission gate 207 is conductive, the logic high output from inverter 205 causes N channel transistor 234 to be conductive, thus pulling output pad 112 to a logic low.

When output pad 112 is at a logic high voltage of VDDM the gate of P channel transistor 268 is at a logic low. When OEL is reduced to a logic low, the gate of transistor 212 is low, causing the gate of transistor 246 to be high. Transistor 246 is conductive which pulls the input of inverter 251 to a logic low. The output of inverter 251 is a logic high. The gate of P channel transistor 264 is high causing P channel transistor 264 to be substantially nonconductive. Because P channel transistor 264 is substantially nonconductive, there is a VT drop across the current electrodes of N channel transistor 262 causing the gate voltage of P channel transistor 268 to be substantially a VT drop below power supply voltage VDDM and P channel transistor 268 is suppose to be substantially non-conductive. However, because of the VT drop across N channel transistor 262, P channel transistor 268 may not remain non-conductive because of insufficient voltage margin causing the output pad voltage to inadvertently change. To solve this problem, as discussed above, P channel transistor 266 functions as a clamping transistor and is used to pull the gate of transistor 268 to the bulk potential, thus insuring that P channel transistor 268 remains off. Transistor 266 is made conductive through the following path: The logic high voltage at the output terminal of inverter 205 is provided to the input terminal of inverter 255. Inverter 255 provides a logic low to the gate of N channel transistor 248 of level shifter 243 causing N channel transistor 248 to be substantially non-conductive, thus providing the high voltage to the input of inverter 259. The output of inverter 259 is low, pulling the gate of transistor 266 low. Note that clamping transistor 231 functions like transistor 266.

Figure 4:
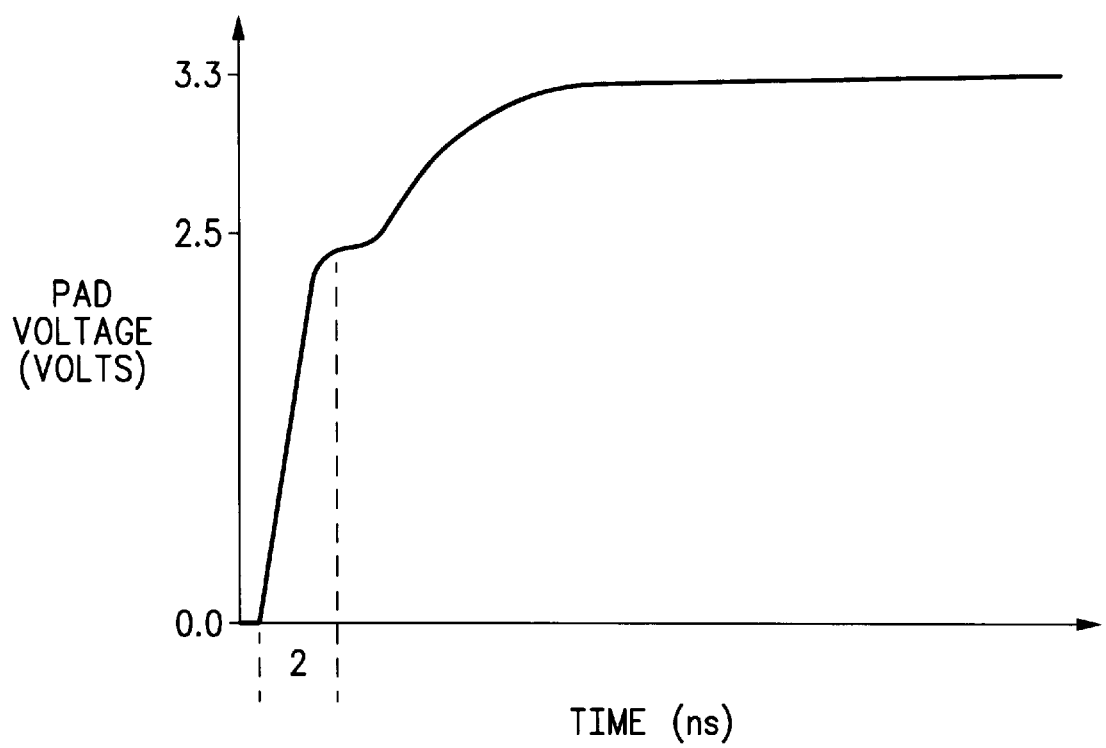
FIG. 4 illustrates, in an XY plot, a low-to-high voltage transition of the output pad of FIG. 3 when used in the output buffer of FIG. 2.

FIG. 4 illustrates the output pad waveform of output buffer 100 during a low-to-high transition of the data output signal. The first straight line portion of the wave form from 0 volts to just below 2.5 volts is provided by low voltage driver 110. As the pad voltage approaches 2.5 volts, low voltage driver 110 is disabled by pad voltage detection circuit and switch 111 as discussed above. There is a short amount of time between when low voltage driver 110 stops providing drive to pad 112 and when medium voltage driver 108 is enabled. This is shown in FIG. 4 by the relatively flat portion of the waveform at 2.5 volts. After low voltage drive 110 stops providing drive, medium voltage driver 108 continues to pull the output pad voltage up to VDDM, which is 3.3 volts in the illustrated embodiment. The slope of the voltage rise from 2.5 volts to 3.3 volts in FIG. 4 is more gradual because P channel transistor 268 is relatively weak compared to P channel transistor 230, and P channel transistor 268 requires more time to pull the voltage up to its final voltage of VDDM.

This two-stage low-to-high driving methodology ensures that output buffer 100 will have less delay time from input (DO) to output pad 112 as a data signal propagates through output buffer 100. In addition, medium voltage driver 108 and low voltage driver 110 contain protection transistors 228 and 266. Protection transistors 228 and 266 allow programming on reset to be accomplished in an error free manner through use of the output pad 112 as an input during reset operations.

Although the present invention has been described with reference to a specific embodiment, further modifications and improvements will occur to those skilled in the art. It is to be understood therefore, that the invention encompasses all such modifications that do not depart from the spirit and scope of the invention as defined in the appended claims.

What is claimed is:

1. An output buffer circuit comprising:

a first voltage driver having an output coupled to a pad, the first voltage driver being coupled to receive a first power supply voltage and being coupled to drive the pad to a first voltage that is approximately the first power supply voltage depending upon a data signal and a first output enable signal;

a second voltage driver having an output coupled to the pad, the second voltage driver being coupled to receive a second power supply voltage and being coupled to drive the pad to a second voltage that is approximately the second power supply voltage depending upon the data signal and the first output enable signal, the first power supply voltage and the second power supply voltage being different; and wherein the second voltage driver is coupled to drive the pad for a first time period until the second voltage is obtained on the pad, at which time the first voltage driver is used to drive the pad from the second voltage to the first voltage.

2. The output buffer circuit of claim 1 further comprising:

a third voltage driver having an output coupled to the pad, the third voltage driver being coupled to receive a third power supply voltage and being coupled to drive the pad to either a third voltage that is approximately the third power supply voltage depending upon the data signal and a second output enable signal, all of the third power supply voltage, the second power supply voltage and the first power supply voltage being different.

3. The output buffer circuit of claim 1 wherein the first voltage supply is greater than the second voltage supply and the third voltage supply is greater than the first voltage supply.

4. The output buffer circuit of claim 1 comprising:

a pad voltage detection circuit and switch which detects an output on the pad voltage to determine when to stop driving the pad using the second voltage driver, and allowing the first voltage driver to continue driving the pad to the first voltage.

5. The output buffer circuit of claim 1 comprising:

a level shifter coupled between the data signal and the first voltage driver wherein the level shifter converts a low voltage provided on the data signal to a higher voltage so that the first driver circuit operates on the higher voltage to drive the pad.

6. The output buffer circuit of claim 5 wherein the second driver circuit is driving the pad while the first driver circuit is awaiting a provision of the higher voltage.

7. An output buffer circuit comprising:

a pad output;

a pull up transistor having a gate electrode, the pull up transistor having a channel region coupled between the pad output and a voltage supply, the pull up transistor having a bulk connection;

a pull down transistor coupled between the pad output and a ground terminal;

a first switch having an input and an output, the output of the first switch being coupled to the gate electrode of the pull up transistor;

an inverter having an input coupled to the input of the first switch and an output; and a clamping transistor having an input coupled to the output of the inverter and a channel region coupled between the bulk connection of the pull up transistor and the gate electrode of the pull up transistor.

8. The output buffer circuit of claim 7 further comprising:

a second switch coupled to the voltage supply and the pad output, the second switch having an output coupled to the bulk connection of the pull up transistor whereby the bulk connection is provided with the higher of either the voltage supply or a voltage on the pad output.

9. The output buffer circuit of claim 8 wherein the second switch comprises:

a first p channel transistor being gated by the voltage supply and having a channel region coupled between the pad output and the bulk connection of the pull up transistor; and a second p channel transistor being gated by the pad output and having a channel region coupled between the voltage supply and the bulk connection of the pull up transistor.

10. The output buffer circuit of claim 7 wherein the first switch comprises a p channel transistor coupled in parallel with an n channel transistor wherein the p channel transistor has a gate electrode coupled to the pad output and the n channel transistor has a gate electrode coupled to the voltage supply.

11. The output buffer circuit of claim 7 being coupled to the pad output in addition to two other pad output drivers, the two other pad output drivers being coupled to the pad output so that the pad output may be driven to one of three different voltage levels at different times.

12. An output buffer circuit comprising:

a pad output;

a first pull up transistor having a gate electrode, the first pull up transistor having a channel region coupled between the pad output and a first voltage supply, the first pull up transistor having a bulk connection;

a pull down transistor coupled between the pad output and a ground terminal;

a first switch having a control electrode, an input, and an output, the output of the first switch being coupled to the gate electrode of the first pull up transistor; and a device coupled between the pad output and the control electrode of the first switch to detect a selected voltage at the pad and to switch off the first switch and turn off the first pull up transistor when the selected voltage is detected.

13. The output buffer of claim 12 comprising:

a clamping transistor having a gate electrode coupled to an output of the device, a channel region coupled between the gate electrode of the first pull up transistor and the pad output, and a bulk connection coupled to a bulk connection of the first pull up transistor.

14. The output buffer of claim 12 comprising:

a second switch receiving as input the first supply voltage and the pad output and providing the greater of the first supply voltage or the pad output to the bulk connections of the clamping transistor and the first pull up transistor.

15. The output buffer circuit of claim 12 having a second output buffer
circuit coupled to the pad output and comprising:

a second pull up transistor having a gate electrode, the second pull up transistor having a channel region coupled between the pad output and a second voltage supply, the second pull up transistor having a bulk connection;

a second switch having an input and an output, the output of the second switch being coupled to the gate electrode of the second pull up transistor;

an inverter having an input coupled to the input of the second switch and an output; and a clamping transistor having an input coupled to the output of the inverter and a channel region coupled between the bulk connection of the second pull up transistor and the gate electrode of the second pull up transistor.

16. The output buffer circuit of claim 15 further comprising:

a third switch coupled to the second voltage supply and the pad output, the third switch having an output coupled to the bulk connection of the second pull up transistor whereby the bulk connection of the second pull up transistor is provided with the higher of either the second voltage supply or a voltage on the pad output.

17. The output buffer circuit of claim 15 further comprising:

a third output buffer in addition to the first and second output buffers wherein the third output buffer is coupled to the pad output whereby the first, second, and third output buffers allow the pad output to be driven to three different voltage levels at different times.

18. The output buffer circuit of claim 12 being coupled to the pad output in addition to two other pad output drivers, the two other pad output drivers being coupled to the pad output so that the pad output may be driven to one of three different voltage levels at different times.

19. A method for driving an output voltage onto an output pad using an output driver circuit, the method comprising the steps of:

(a) using a first output buffer in the output driver circuit to drive a voltage on the output pad from a first voltage to a second voltage;

(b) detecting the voltage on the output pad to determine when the second voltage is obtained on the output pad; and (c) switching, once the second voltage is detected in step (b), the output driver circuit to use a second output buffer to drive the output pad from the second voltage to a third voltage, the first output buffer and the second output buffer being powered with different voltage supplies.

20. The method of claim 19 further comprising the steps of:

(d) detecting the voltage on the output pad to determine when the third voltage is obtained on the output pad; and (e) switching, once the third voltage is detected in step (d), the output driver circuit to use a third output buffer to drive the output pad from the third voltage to a fourth voltage, the first output buffer, the second output buffer, and the third output buffer all being powered with different voltage supplies.

\* \* \* \* \*